US006613663B2

(12) United States Patent
Furuya

(10) Patent No.: US 6,613,663 B2
(45) Date of Patent: Sep. 2, 2003

(54) METHOD FOR FORMING BARRIER LAYERS FOR SOLDER BUMPS

(75) Inventor: Akira Furuya, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/006,367

(22) Filed: Dec. 10, 2001

(65) Prior Publication Data

US 2002/0072215 A1 Jun. 13, 2002

(30) Foreign Application Priority Data

Dec. 8, 2000 (JP) ........................................ 2000-374517

(51) Int. Cl.[7] .............................................. H01L 21/44
(52) U.S. Cl. ........................ 438/613; 438/614; 438/652; 438/656; 438/685
(58) Field of Search ................................ 438/612, 613, 438/614, 615, 108, 652, 648, 656, 685, 687, 674

(56) References Cited

U.S. PATENT DOCUMENTS

| 4,330,343 | A | * | 5/1982 | Christou et al. ..... 148/DIG. 20 |
| 5,796,168 | A | * | 8/1998 | Datta et al. .................. 257/762 |
| 6,204,168 | B1 | * | 3/2001 | Naik et al. .................. 438/622 |
| 6,281,106 | B1 | * | 8/2001 | Higdon et al. .............. 438/612 |
| 6,319,846 | B1 | * | 11/2001 | Lin et al. ........................ 216/13 |
| 6,329,608 | B1 | * | 12/2001 | Rinne et al. ................. 174/260 |
| 6,379,782 | B2 | * | 4/2002 | Iguchi et al. ................ 257/622 |
| 2002/0027269 | A1 | * | 3/2002 | Hashimoto .................. 257/669 |
| 2002/0074242 | A1 | * | 6/2002 | Morrissey et al. .......... 205/704 |
| 2002/0092968 | A1 | * | 7/2002 | Hula et al. ................... 250/208 |
| 2002/0105076 | A1 | * | 8/2002 | Lin ............................. 257/738 |

FOREIGN PATENT DOCUMENTS

| JP | 8-45941 | 2/1996 |
| JP | 9-186161 | 7/1997 |
| JP | 11-74298 | 3/1999 |
| JP | 11-214418 | 8/1999 |

* cited by examiner

Primary Examiner—Kevin M. Picardat
(74) Attorney, Agent, or Firm—Young & Thompson

(57) ABSTRACT

A method for manufacturing a semiconductor device: forming a seed layer 22 on a semiconductor substrate 10 having a pad electrode 14; forming a protective layer 24 on the seed layer 22; forming a mask 30 having an opening 40 on the protective layer 24 above the pad electrode; etching the protective layer 24 exposed in the opening 40 to expose the seed layer 22; depositing a plating film 50 serving as a barrier metal on the seed layer 22; and forming a solder bump on the plating film 50. The seed layer is covered with the protective layer, and the protective layer 24 is selectively removed with respect to the seed layer 22 immediately before the plating step. As a result, it is possible to prevent the oxidation of the seed layer 22 in the step after the formation of the protective layer.

20 Claims, 3 Drawing Sheets

METHOD FOR FORMING BARRIER LAYERS FOR SOLDER BUMPS

BACKGROUND OF THE INVENTION

1. Field of the Invention

The present invention relates to a method for manufacturing a semiconductor device having solder bumps. More particularly, it relates to a method of forming a barrier metal layer between a solder bump and a pad electrode by a plating method.

2. Description of the Prior Art

In recent years, a method using solder bumps for the connection between a semiconductor chip and a substrate, or the connection between a semiconductor package and the substrate has come into wide use. Below, a description will be given to flip chip technology in which a solder bump is formed via a barrier metal on a pad electrode of a semiconductor chip as a prior art example.

In a flip chip, in order to prevent a reduction in interface strength, a monolayer or multilayer metal film (below, referred to as a "barrier metal layer") which prevent the diffusion of a solder component into the pad electrode is inserted between a solder bump and a pad electrode of a semiconductor chip. Among the components of the solder, the reactivity of tin with the barrier metal layer is high. Therefore, in the prior art, there have been used a method in which solder with low tin content is used, or a method in which the barrier metal layer is increased in thickness.

However, in recent years, lead-free solder containing Sn as a main component has become studied for preventing the environmental pollution. At present, we conduct a study of the use of a multilayer film including a Ni film, a Cr film, or an alloy layer mainly containing them as the barrier metal layer.

It is possible to improve the reliability due to the barrier metal layer by increasing the barrier metal film thickness, and increasing the diffusion length. The barrier metal layer is formed by using a sputtering method or a plating method. The plating method has a higher throughput. Accordingly, it is more suitable for forming a thick-film barrier metal layer. Therefore, the barrier metal layer is often formed by plating.

Particularly, an electroplating method allows selective growth by using a mask, and thereby offers the following advantages.

(1) It is possible to more reduce the warpage of a substrate due to film stress as compared with blanket deposition method;

(2) In blanket deposition method, in addition to a plating seed layer, a plating film must be subjected to etching processing to form a barrier metal pad. Whereas, in selective growth method, processing of only the plating seed layer is sufficient, and hence processing is easier as compared with blanket deposition method; and (3) The material cost is lower as compared with the blanket deposition method because of selective growth.

The formation process of the barrier metal layer according to the prior-art electroplating method will be described by reference to FIGS. 1A–1C. On a semiconductor substrate 10, a pad electrode 14 is provided via an insulating film 12. A passivation film 16 provided over electrodes including the pad electrode is provided with an opening on the pad electrode. On the whole surface of such a semiconductor substrate, first, as shown in FIG. 1A, an adhesion layer 20 and a seed layer 22 are successively formed by sputtering.

Then, as shown in FIG. 1B, a photosensitive film 30 of photoresist commonly used in a semiconductor industry, polyimide, a dry film, or the like is directly formed on the seed layer 22. Thereafter, an opening 40 is formed therein by exposure and development. Subsequently, as shown in FIG. 1C, a plating film 50 is formed by an electroplating method in the opening 40.

The aforesaid seed layer for electroplating may be formed by using a material containing Ni or Cr, which is the same material as the plating film, as a main component, or by using a material containing Cu as a main component. The seed layer and the plating film are made of the same material for the following purpose. Namely, by using the same material, the interfacial mismatch is reduced, with the result that the interfacial adhesion and the plating film quality are improved. However, in actuality, on the seed layer surface prior to plating, an oxide film is formed. For this reason, the interface between the seed layer and the plating film becomes the seed layer oxide film/plating film. Accordingly, both the interfacial adhesion and the plating film quality are inferior.

The oxide film on the seed layer surface is formed from reaction with oxygen by exposure to atmosphere in a step after seed layer formation, and an oxygen plasma treatment before the plating step. The oxygen plasma treatment before the plating step is performed for removing the organic residue left in the opening of the photosensitive film, and for enhancing the wettability of the seed layer or the photosensitive film, and thereby improving the plating property.

When the main component of the seed layer is Ni or Cr, the oxide film is a corrosion resistant passive state film. In a conventional plating step, the surface oxide film is removed by a chemical solution of an acid or the like. However, when the oxide film is passive, it is difficult to remove. The study by the present inventor proves that the removability is improved by an increase in time, an increase in concentration, an increase in temperature, or the like of the acid treatment. It has been also shown that the interfacial adhesion and the film quality are improved at this step. However, it has been also shown that, if the acid treatment enough for sufficiently removing the oxide film is performed, the deformation of the photosensitive film and a reduction in adhesion between the photosensitive film and the seed layer cause the degradation of the photosensitive film such as peeling or immersion of the chemical solution. Namely, the amount of the oxide film removed by the acid treatment and the chemical resistance of the photosensitive film are in a relationship of trade-off. Therefore, it is difficult to completely remove the oxide film by the chemical treatment with an acid or the like. Even if the conditions for ensuring the compatibility therebetween are satisfied, the process margin is small, so that the application thereof to actual production is difficult.

In order to improve the adhesion, there is proposed the deposition by a two-stage plating process in which strike plating is performed, followed by conventional plating (Japanese Published Unexamined Patent Application No. Hei 9-186161). With this method, as shown in FIG. 2, a Ni strike plating film 50a for improving the adhesion is formed on a Ni seed layer, and thereafter, a conventional Ni plating film 50b is successively formed thereon. However, our study proves as follows. Namely, even if strike plating is performed, the adhesion is lower as compared with the case where a sufficient acid treatment has been performed. As a result, the plating layer peels off from the seed layer with ease.

On the other hand, a study has been also made on a method in which a material containing Cu as a main component is used for the seed layer. This is for the following reasons: a good plating film is expected to be formed due to the implementation of the good film quality of the seed layer; and production and development thereof are easy because Cu has a high track record as a material for buried wiring of a semiconductor. However, Cu is rich in reactivity. Therefore, for example, when polyimide is used for the photosensitive film, the interface between Cu and polyimide reacts at a temperature of 200° C. or less to form a reaction layer. Further, an alkaline developing solution for developing the photosensitive film reacts with the Cu surface at room temperature.

It is also possible to remove the reaction layer by subjecting it to a chemical solution treatment prior to plating. However, after removal, the film thickness of the seed layer is decreased by the thickness corresponding to the reaction amount. If the film thickness is small, the sheet resistance of the seed film is increased. Therefore, the range (variation) of the electric potential distribution in the substrate plane during electroplating is increased. The deposition rate of the plating film strongly depends upon the electric potential. Accordingly, this electric potential distribution increases the range (variation) of the film thickness distribution of the plating film. In general, the film thickness of the reaction layer has a substrate in-plane distribution. This further increases the range of the film thickness distribution of the plating layer for the same reason. In a semiconductor device in which a large number of solder bumps are arranged on the whole surface of the semiconductor chip, the proportion of the area of the opening provided in the photosensitive film to the substrate area is large. Accordingly, the range of the plating film thickness distribution described above becomes noticeable.

Further, some reaction layers are difficult to remove by a chemical solution. In such a case, the reaction layer at the interface between the plating layer and the seed layer causes the degradation in the film quality of the plating layer, or the degradation in the adhesion of the interface between the plating layer and the seed layer.

As described above, the following two are the immediate problems: (1) when the seed layer forms a passive state oxide film as with Ni or Cr, high adhesion and good film quality cannot be obtained by a prior-art technique; and (2) when the seed layer reacts with the photosensitive film as with Cu, the in-plane nonuniformity of the plating film thickness is caused by a prior-art chemical removal.

SUMMARY OF THE INVENTION

In view of the foregoing circumstances, it is therefore an object of the present invention to provide a method of manufacturing a semiconductor device whereby high adhesion and good film quality can be obtained even when a seed layer forms a passive state oxide film; and good in-plane uniformity of a plating layer can be obtained even when the seed layer reacts with a photosensitive film, thereby allowing the reliability and productivity improvements.

In order to attain the foregoing object, a method for manufacturing a semiconductor device of the present invention, includes the steps of: providing a substrate having a connecting site; forming a seed layer over the connecting site; forming a protective layer on the seed layer; forming a mask on the protective layer, the mask having an opening over the connecting site; removing the protective layer to exposed the seed layer in the opening; forming a plating film on the seed layer exposed in the opening; and forming a solder bump on the plating film.

According to the present invention, the seed layer is covered with the protective layer, and the protective layer is selectively removed with respect to the seed layer immediately before the plating step. As a result, it is possible to prevent the oxidation of the seed layer in a step after formation of the protective layer. Further, it is also possible to prevent the seed layer from reacting with the photosensitive film or the developing solution of the photosensitive film. Therefore, it is possible to improve the adhesion of the plating film/seed layer interface, and it is possible to improve the substrate in-plane uniformity of the plating film thickness.

BRIEF DESCRIPTION OF THE DRAWINGS

The above and other objects, advantages and features of the present invention will be more apparent from accompanying drawings, in which.

DETAILED DESCRIPTION OF THE PREFERRED EMBODIMENT

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1A:
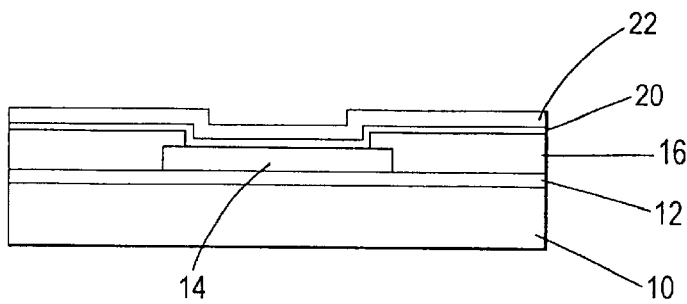
FIGS. 1A to 1C are cross sectional views for illustrating the process of forming a barrier metal layer by a prior-art electroplating method.
Figure 1B:
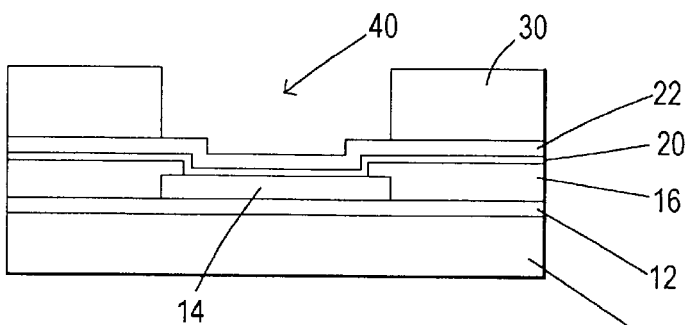
Figure 1C:
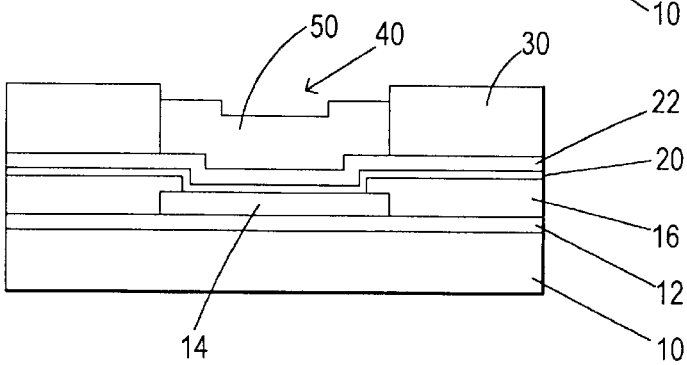
Figure 2:
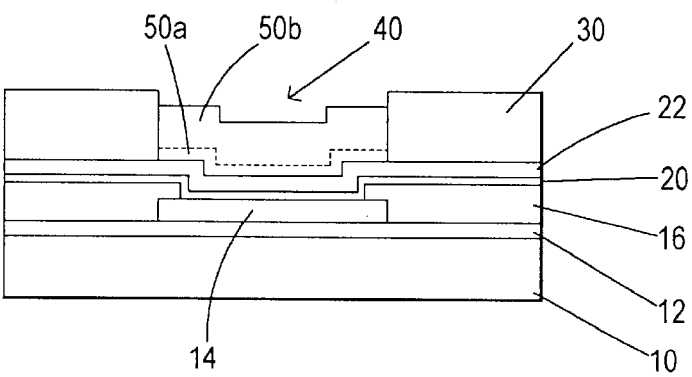
FIG. 2 is a cross sectional view for illustrating the process of forming a barrier metal layer by a prior-art two-stage electroplating method.
Figure 3A:
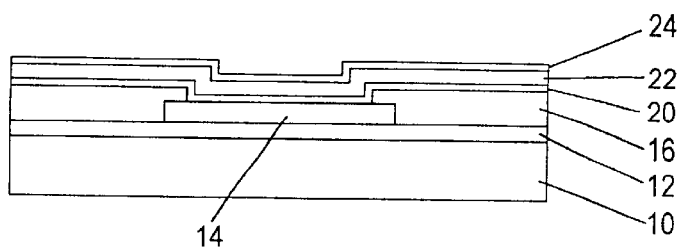
FIGS. 3A to 3F are cross sectional views for illustrating the process of forming a semiconductor device having solder bumps in accordance with an example of the present invention.

As shown in FIG. 3A, on a semiconductor substrate 10, a pad electrode 14 for external connection terminal is provided via an insulating film 12. In a passivation film 16 provided over electrodes including the pad electrode 14, an opening is provided on the pad electrodes 14. The semiconductor substrate 10 of the present invention is made of a material commonly used in a semiconductor industry. Examples thereof include all the ones in each of which active elements are formed on a Si substrate, a SOI (silicon on insulator) substrate, a silicon on sapphire substrate, a compound semiconductor substrate, or a glass substrate.

On the semiconductor substrate 10, in general, a large number of active elements are formed. However, these active elements are not shown in the drawings of this patent application in the interest of clarity of the drawings.

As the insulating film 12, a silicon dioxide film, a silicon oxynitride film, an organic insulating film such as a polyimide film, or the like is used. In general, this insulating film constitutes the uppermost interlayer insulating film of a multilayer wiring structure formed on the semiconductor substrate 10.

For the pad electrodes of the present invention Cu, Al, or an Al—Cu alloy is used. The one composed of a multiple film in which a Ti film and a TiN film are successively formed on the metal film is also preferably used instead.

Examples of the passivation film 16 include a polyimide film, a silicon dioxide film, a silicon oxynitride film, or a multiple film in which a silicon oxynitride film is formed on a silicon dioxide film, and other films known as passivation films in a semiconductor industry.

In a first embodiment of the present invention, the same type of materials are used for a seed layer and a plating film. As the seed layer, a Ni film, a Cr film, or an alloy film containing these metals as main components is used. Below, a description will be given to the case of the Ni film. First, as shown in FIG. 3A, on the whole surface of the semiconductor substrate 10 on which the pad electrode 14 and the passivation film 16 having openings on the respective pad electrodes are formed, an adhesion layer 20, a seed layer 22, and a protective layer 24 are successively deposited by a sputtering method. Herein, the adhesion layer 20 is a Ti film, a TiW film, or a multiple film thereof, having a thickness of about 50 nm. As the seed layer 22, Ni is deposited with a thickness of about 300 nm thereon. As the protective layer 24 formed on the Ni seed layer 22, an about 50-nm thick Cu layer is used in this embodiment. In order to prevent a passive state oxide film from being formed on the Ni seed layer 22 surface, desirably, at least after deposition of the seed layer 22, the protective layer 24 is successively deposited thereon in vacuum without exposing the seed layer 22 to atmosphere.

Figure 3B:
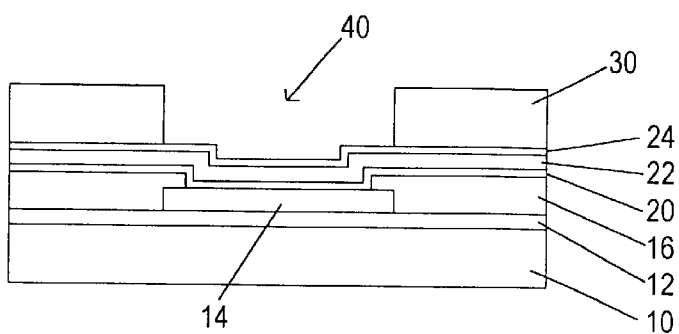

Then, as shown in FIG. 3B, as a photosensitive film 30, for example, 10 μm thick photoresist is applied onto the protective layer 24. Exposure and development thereof are performed to form an opening 40 above the pad electrode 14. After formation of the opening 40, a treatment is performed with plasma containing oxygen to remove the organic residue left on the protective layer 24 exposed in the opening.

Figure 3C:
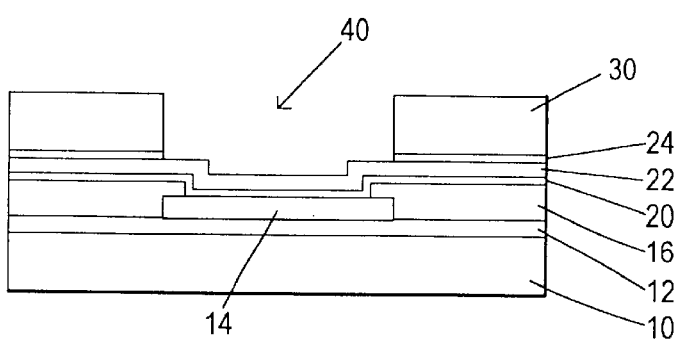

Subsequently, as shown in FIG. 3C, the protective layer 24 is selectively removed with respect to the seed layer 22 by a wet etching process. In this embodiment, in order to selectively remove the protective layer 24 made of Cu with respect to the seed layer 22 made of Ni, an etching solution consist of HF, $H_2O_2$, and water is used. The Cu protective layer 24 is the material which will not undergo formation of a passive state oxide film on its own surface. Therefore, it is possible to selectively remove the protective layer 24 to a sufficient degree with respect to the seed layer 22 while maintaining the chemical resistance of the photoresist by using the aforesaid etching solution.

Figure 3D:
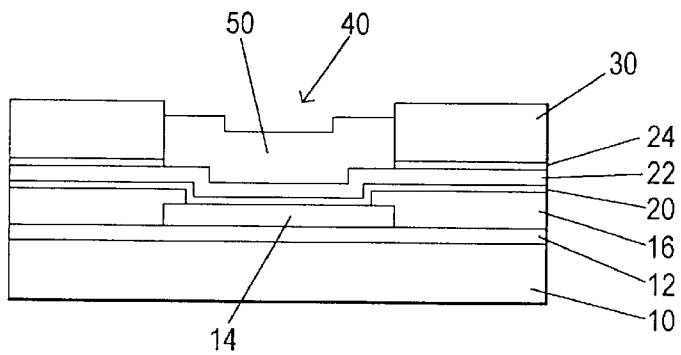

FIG. 3D is a cross sectional view for showing the state in which a plating film 50 is selectively formed on the seed layer 22. After selectively removing the protective layer 24 by an etching solution, water rinse is performed. After the water rinse step, the semiconductor substrate 10 is held in a plating solution without performing a drying step in order to prevent the oxidation of the seed layer 22 by air. The plating solution is a solution containing nickel sulfamate. An Ni plating film 50 with a thickness of several micrometers is formed by an electroplating method. At this step, the adhesion layer 20, the seed layer 22, and the protective layer 24 function as the current path for electroplating.

Figure 3E:
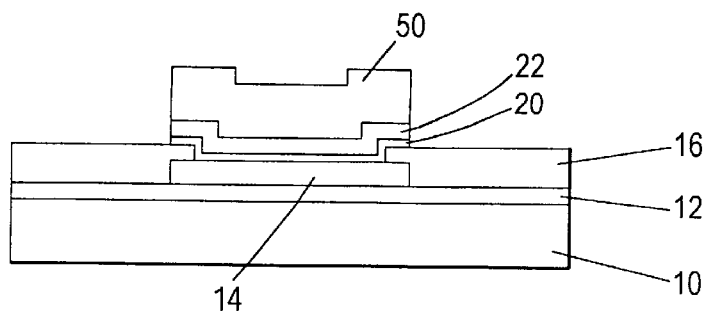

After the formation of the plating film 50, the photosensitive film 30 is removed by a dry process or a wet process, which is a known technology. Subsequently, a mask made of photoresist is formed on the plating film 50 by a photolithography technology. The size of the mask is the same as or a little larger than that of the plating film 50. By using this mask, the unnecessary protective layer 24, seed layer 22, and adhesion layer 20 are removed by etching in order to complete a barrier metal pad. FIG. 3E shows the state in which the mask has been removed after the completion of the etching step.

Figure 3F:
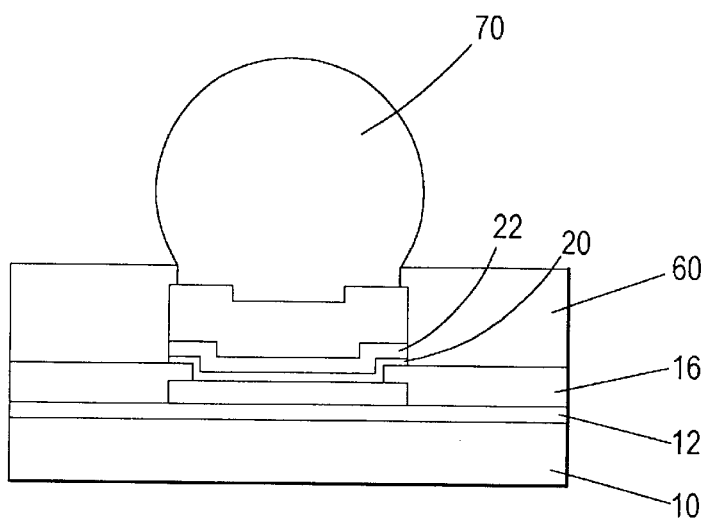

FIG. 3F is a cross sectional view showing the state in which a solder bump 70 is formed on the plating film 50. In this step, first, a polyimide film 60 is formed on the whole surface as a cover film, and an opening is formed therein on the plating film 50 by a photolithography technology. Thereafter, a solder ball made of Pb-free solder such as Sn—Ag eutectic alloy is placed on the plating film 50, and heated to be reflown, thereby forming the solder bump 70.

Figure 4:
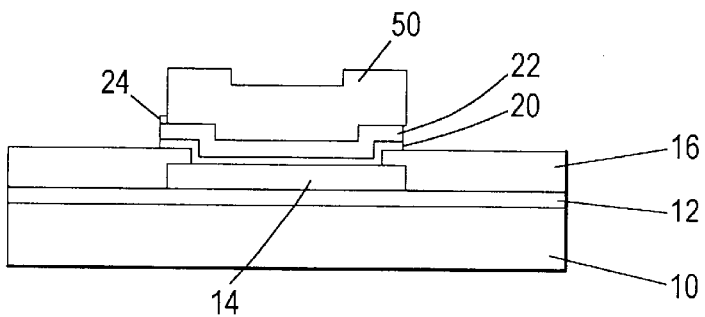
FIG. 4 is a cross sectional view for illustrating the same process step as illustrated in FIG. 3E wherein a misalignment occurred.

FIG. 4 is a cross sectional view for illustrating the same process step as illustrated in FIG. 3E wherein a misalignment occurred. As shown in FIG. 4, even when the mask and the plating film 50 are roughly identical in size with each other, there arises the state in which a part of the protective layer 24 is left according to the misalignment between the exposure mask and the semiconductor substrate. However, no particular problem occurs.

According to the first embodiment described above, the Cu protective layer 24 effectively prevents a passive state oxide film which is the reaction layer of Ni and oxygen from being formed on the Ni seed layer 22 surface by exposing the Ni seed layer 22 to atmosphere prior to coating of the photoresist 30, by exposing the Ni seed layer 22 to atmosphere after exposure and development at the time of formation of the opening 40, or by subjecting the Ni seed layer 22 to the oxygen plasma treatment. Therefore, it is possible to deposit the Ni plating film 50 without oxidizing the Ni seed layer 22 surface. As a result, the Ni seed layer 22 and the Ni plating film 50 show good adhesion to each other, and in addition, the film quality of the Ni plating film 50 is also improved.

The precisely same description as the description of the first example goes for the case in which Cr is used in place of Ni.

In a second embodiment of the present invention, Cu is used for the seed layer 22. This example is different from the first embodiment in the following respects: a Cu layer is used as the seed layer 22; a TiW layer is used as the protective layer 24; and a polyimide film is used as the photosensitive film 30, out of the features shown in FIGS. 3A to 3F. In this embodiment, a $H_2O_2$ aqueous solution is used as an etching solution for selectively removing the TiW protective layer 24 with respect to the Cu seed layer 22. The TiW is also a material which will undergo no occurrence of a passive state oxide film on its own surface. Therefore, by this etching solution, it is possible to selectively remove the TiW protective layer 24 to a sufficient degree with respect to the Cu seed layer 22 while maintaining the chemical resistance of the polyimide film which is a photosensitive film. As the plating film 50, a Ni film or a Cr film is used as with the first example. Except for these respects, a semiconductor device is manufactured in the same manner as in the first example.

According to the second example of the present invention, the reaction layer of polyimide and a developing solution will not be formed on the Cu seed layer 22 surface due to the presence of the TiW protective layer 24. Therefore, it is possible to prevent the increase in film thickness distribution (variation) of the plating film 50 due to the reaction layer removal, the deterioration in adhesion between the Cu seed layer 22 and the plating film 50 due to the residue on removal of the reaction layer, the deterioration in film quality of the plating film 50, and the like. This means that the reliability of the barrier metal between the pad electrode and the solder bump is improved. Therefore, it is possible to improve the reliability of the semiconductor device according to this embodiment. Further, when the TiW protective layer 24 is present, there is no fear of the oxidation of the surface and the inside of the Cu seed layer 22 due to the oxygen plasma treatment. As a result, it is possible to perform a sufficient oxygen plasma treatment. Namely, it is possible to improve the reliability of the semiconductor device by increasing the process margin.

Up to this point, the present invention has been described by way of the preferred embodiments thereof. However, the present invention is not limited only to the constructions of the foregoing embodiments. It is to be understood that various modifications and changes may be made from the constructions of the embodiments within the scope described in the following claims. In the foregoing embodiments, Ni/Cu or Cu/Tiw is used as the combination of the seed layer/protective layer. However, other combinations are also acceptable. Further, the description has been given by using the films of Ni and Cr as the plating films. However, other materials such as Cu are also acceptable. Still further, it is also possible to form a plating film made of Cu or the like on the plating film formed of Ni or Cr for improving the wettability of the solder. Furthermore, as the materials for the photosensitive film serving as a plating mask, there may also be used the materials commonly used in the semiconductor manufacturing process, such as a dry film, other than photoresist and polyimide.

What is claimed is:

1. A method for manufacturing a semiconductor device, comprising the steps of:

providing a substrate having a connecting site;

forming a seed layer over said connecting site;

depositing a protective layer on said seed layer, said protective layer preventing a surface of said seed layer from becoming oxidized;

forming a mask on said protective layer, said mask having an opening over said connecting site;

removing said protective layer to expose said seed layer in said opening;

forming a plating film on said seed layer; and forming a solder bump on said plating film.

2. The method for manufacturing a semiconductor device according to claim 1, further comprising the step of forming an adhesion layer between said connecting site and said seed layer.

3. The method for manufacturing a semiconductor device according to claim 1, wherein said seed layer comprises one of Ni and Cr.

4. The method for manufacturing a semiconductor device according to claim 3, wherein said protective layer comprises Cu.

5. The method for manufacturing a semiconductor device according to claim 4, wherein the step of removing said protective layer is the step of etching with an aqueous solution containing HF and $H_2O_2$.

6. The method for manufacturing a semiconductor device according to claim 1, wherein said seed layer comprises Cu.

7. The method for manufacturing a semiconductor device according to claim 6, wherein said protective layer comprises TiW.

8. The method for manufacturing a semiconductor device according to claim 7, wherein the step of removing said protective layer is the step of etching with an aqueous solution containing $H_2O_2$.

9. A method for manufacturing a semiconductor device, comprising the steps of:

providing a substrate having a plurality of pad electrodes;

forming a seed layer over said plurality of pad electrodes;

depositing a protective layer on said seed layer, said protective layer preventing a surface of said seed layer from becoming oxidized;

forming a photosensitive film over said protective layer and forming openings therein, each of said openings expose said protective layer above each of said pad electrodes;

removing said exposed protective layer to expose said seed layer in said openings;

forming plating films on said seed layer exposed in said openings; and forming solder bumps on said plating films.

10. The method for manufacturing a semiconductor device according to claim 9, further comprising the step of forming an adhesion layer over said pad electrodes and under said seed layer.

11. The method for manufacturing a semiconductor device according to claim 9, wherein said seed layer comprises a metal which forms a passive state oxide film.

12. The method for manufacturing a semiconductor device according to claim 11, wherein said seed layer comprises one of Ni and Cr.

13. The method for manufacturing a semiconductor device according to claim 11, wherein said protective layer comprises a metal which does not form a passive state oxide film.

14. The method for manufacturing a semiconductor device according to claim 13, wherein said protective layer comprises Cu.

15. The method for manufacturing a semiconductor device according to claim 14, wherein the step of removing said protective layer is the step of etching with an aqueous solution containing HF and $H_2O_2$.

16. The method for manufacturing a semiconductor device according to claim 9, wherein said seed layer is made of a metal which reacts with said photosensitive film at 200° C. or less.

17. The method for manufacturing a semiconductor device according to claim 9, wherein said seed layer is made of a metal which reacts with a developing solution of said photosensitive film at room temperature.

18. The method for manufacturing a semiconductor device according to claim 9, wherein said seed layer comprises Cu.

19. The method for manufacturing a semiconductor device according to claim 18, wherein said protective layer comprises TiW.

20. The method for manufacturing a semiconductor device according to claim 19, wherein the step of removing said protective layer is the step of etching with an aqueous solution containing $H_2O_2$.

* * * * *